US011299056B2

(12) United States Patent
Wang et al.

(10) Patent No.: US 11,299,056 B2
(45) Date of Patent: Apr. 12, 2022

(54) SYSTEM AND METHOD FOR CHARGER CONTACTOR DOUBLE WELD DETECTION

(71) Applicant: FORD GLOBAL TECHNOLOGIES, LLC, Dearborn, MI (US)

(72) Inventors: Rui Wang, Canton, MI (US); Aaron Walker, Auburn Hills, MI (US); Yuan Zhang, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 309 days.

(21) Appl. No.: 16/707,770

(22) Filed: Dec. 9, 2019

(65) Prior Publication Data

US 2021/0170899 A1 Jun. 10, 2021

(51) Int. Cl.
| | |
|---|---|
| *B60L 53/62* | (2019.01) |
| *B60L 58/12* | (2019.01) |
| *H02J 7/00* | (2006.01) |
| *B60L 58/20* | (2019.01) |
| *B60L 3/00* | (2019.01) |
| *G01R 31/327* | (2006.01) |
| *B60L 3/04* | (2006.01) |
| *H02H 3/20* | (2006.01) |

(52) U.S. Cl.
CPC .............. *B60L 53/62* (2019.02); *B60L 3/0023* (2013.01); *B60L 3/0069* (2013.01); *B60L 3/0092* (2013.01); *B60L 3/04* (2013.01); *B60L 58/12* (2019.02); *B60L 58/20* (2019.02); *G01R 31/3275* (2013.01); *G01R 31/3278* (2013.01); *H02J 7/0048* (2020.01); *H02J 7/007182* (2020.01); *H02H 3/207* (2013.01); *H02J 7/0031* (2013.01)

(58) Field of Classification Search
CPC .......... B60L 53/62; B60L 58/12; B60L 58/20; B60L 50/51; B60L 58/10; B60L 50/66; B60L 53/22; B60L 53/16; B60L 11/08; B60L 11/1816; H02J 7/00; H02J 7/007182; H02J 7/0048; H02J 7/0029; G07C 5/08; G01R 31/00
USPC .................................... 361/23, 179; 307/9.1
See application file for complete search history.

(56) References Cited

U.S. PATENT DOCUMENTS

| | | |
|---|---|---|
| 7,404,459 B2 | 7/2008 | Nakanishi et al. |
| 8,513,953 B2 | 8/2013 | Myoen et al. |
| 9,260,015 B2 | 2/2016 | Gonzales et al. |

(Continued)

*Primary Examiner* — Danny Nguyen
(74) *Attorney, Agent, or Firm* — David B. Kelley; Brooks Kushman P.C.

(57) ABSTRACT

A vehicle includes charger contactors configured to selectively electrically couple terminals for connecting to a charger to corresponding terminals of a high-voltage bus. The vehicle includes a precharge contactor configured to selectively couple a terminal of a battery to the high-voltage bus through an impedance element. The vehicle includes a controller programmed to command the charger contactors to an open state for a drive cycle and command the precharge contactor to close at a start of the drive cycle and, responsive to a voltage across the terminals for connecting to the charger changing from being less than a first predetermined voltage immediately prior to the precharge contactor being closed to being greater than a second predetermined voltage at a completion of precharging, inhibit vehicle operation and disconnect the battery from the high-voltage bus.

20 Claims, 4 Drawing Sheets

(56) References Cited

U.S. PATENT DOCUMENTS

2016/0243954 A1* 8/2016 Moro .................. B60L 58/12
2019/0237979 A1* 8/2019 Yamada ................ H02J 7/0029

* cited by examiner

SYSTEM AND METHOD FOR CHARGER CONTACTOR DOUBLE WELD DETECTION

TECHNICAL FIELD

This application generally relates to detecting welded contactors between charger terminals and a high-voltage power bus in a vehicle.

BACKGROUND

Electrified vehicles include high-voltage components that are connected to a high-voltage bus. The high-voltage bus may include elements that selectively isolate the high-voltage components from one another. During normal conditions, the selective isolation elements may operate properly. However, under abnormal conditions, the selective isolation elements may be in an improper state.

SUMMARY

A vehicle includes charger contactors configured to selectively electrically couple terminals for connecting to a charger to corresponding terminals of a high-voltage bus. The vehicle includes a precharge contactor configured to selectively couple a battery to the high-voltage bus through an impedance element. The vehicle includes a controller programmed to, at a start of a drive cycle, command the charger contactors to open and then command the precharge contactor to close for charging the high-voltage bus to a predetermined bus voltage and, responsive to a voltage across the terminals for connecting to the charger changing from being less than a first predetermined voltage immediately prior to the precharge contactor being closed to being greater than a second predetermined voltage when the high-voltage bus is charged to the predetermined bus voltage, command the precharge contactor to open and command a main contactor coupled between the battery and the high-voltage bus to remain open to disconnect the battery from the high-voltage bus and prevent vehicle operation.

The first predetermined voltage may be a threshold that is indicative of the voltage being approximately zero. The second predetermined voltage may be a threshold that is indicative of the voltage being at a high-voltage level. The controller may be further programmed to, responsive to a voltage across the high-voltage bus being greater than the second predetermined voltage and the voltage across terminals for connecting to the charger being greater than the second predetermined voltage prior to the precharge contactor being closed, command the precharge contactor to open and command the main contactor to remain open to inhibit vehicle operation and prevent connection of the battery to the high-voltage bus. The controller may be further programmed to output a diagnostic code indicative of a double weld contactor condition responsive to inhibiting vehicle operation. The controller may be programmed to, responsive to the voltage being less than the first predetermined voltage immediately prior to the precharge contactor being closed and the voltage being less than the second predetermined voltage when the high-voltage bus is charged to the predetermined bus voltage, command the main contactor to close and command the precharge contactor to open. The controller may be further programmed to, responsive to a difference between a first voltage measured across the terminals for connecting to the charger while the precharge contactor is closed and a second voltage measured across the terminals for connecting to the charger immediately prior to closing the precharge contactor being greater than a threshold for a predetermined time, command the precharge contactor to open and command the main contactor to remain open to prevent connection of the battery to the high-voltage bus.

A vehicle includes charger contactors configured to selectively electrically couple positive and return terminals for connecting to a charger to corresponding terminals of a high-voltage bus. The vehicle includes a precharge contactor configured to selectively couple a battery to the high-voltage bus through an impedance element. The vehicle includes a controller programmed to, at a start of a drive cycle, command the charger contactors to open and then command the precharge contactor to close, and, responsive to a difference between a first voltage measured across the positive and return terminals when the precharge contactor is closed and a second voltage measured across the positive and return terminals immediately prior to closing the precharge contactor being greater than a predetermined threshold, command the precharge contactor to open and command a main contactor coupled between the battery and the high-voltage bus to remain open to prevent connection of the battery to the high-voltage bus.

The predetermined threshold may be indicative of the difference increasing during precharging. The controller may be further programmed to output a diagnostic code indicative of a double weld contactor condition responsive to inhibiting vehicle operation. The controller may be further programmed to, responsive to the difference being less than the predetermined threshold for a duration of precharging, command the main contactor to close and command the precharge contactor to open. The controller may be further programmed to, responsive to voltage across the high-voltage bus being greater than a predetermined voltage and voltage across terminals for connecting to the charger being greater than the predetermined voltage prior to the precharge contactor being closed, command the precharge contactor to open and command the main contactor to remain open to prevent connection of the battery to the high-voltage bus and inhibit vehicle operation. The predetermined voltage may be a threshold indicative of voltage across terminals for connecting to the charger exceeding a high-voltage level.

A method includes commanding, by a controller, charger contactors disposed between terminals for connecting to a charger to corresponding terminals of a high-voltage bus to open at a start of a drive cycle. The method includes commanding, by a controller, a precharge contactor that couples a traction battery to a high-voltage bus through an impedance to close for charging the high-voltage bus to a predetermined bus voltage. The method includes commanding, by the controller, the precharge contactor to open and commanding a main contactor coupled between the traction battery and the high-voltage bus to remain open responsive to a voltage across the terminals for connecting to the charger changing from being less than a first predetermined voltage immediately prior to the precharge contactor being closed to being greater than a second predetermined voltage when the high-voltage bus is charged to the predetermined bus voltage.

The method may further include outputting, by the controller, a diagnostic code indicative of a double weld contactor condition. The first predetermined voltage may be a threshold indicative of the voltage being approximately zero. The second predetermined voltage may be a threshold indicative of the voltage being at a high-voltage level. The method may further include commanding, by the controller, the precharge contactor to open and commanding a main contactor coupled between the traction battery and the high-voltage bus to remain open responsive to a voltage across the high-voltage bus being greater than the second predetermined voltage and the voltage across terminals for connecting to the charger being greater than the second predetermined voltage prior to the precharge contactor being closed. The method may further include commanding, by the controller, the main contactor to close and commanding the precharge contactor to open, both responsive to the voltage being less than the first predetermined voltage immediately prior to the precharge contactor being closed and the voltage being less than the second predetermined voltage when the high-voltage bus is charged to the predetermined bus voltage. The method may further include, responsive to a difference between a first voltage measured across the terminals for connecting to a charger while the precharge contactor is closed and a second voltage measured across the for connecting to a charger immediately prior to closing the precharge contactor being greater than a threshold for a predetermined time, commanding the precharge contactor to open and command the main contactor to remain open to prevent connection of the traction battery to the high-voltage bus.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Electrified vehicles include contactors to selectively connect and isolate high-voltage components. The contactors may be electromagnetic switches such as relays. In a high-voltage environment, switches can experience high levels of stress. The high voltages present in an electrified vehicle can cause an electrical arc between the switch contacts. The electrical arcing may occur as the switch opens or closes. The temperature of the electrical arc can be high enough to cause the switch contacts to melt. In severe cases, the contactor can become welded closed. In the welded closed condition, the contactor no longer responds to commands to change the contactor state.

Figure 1:
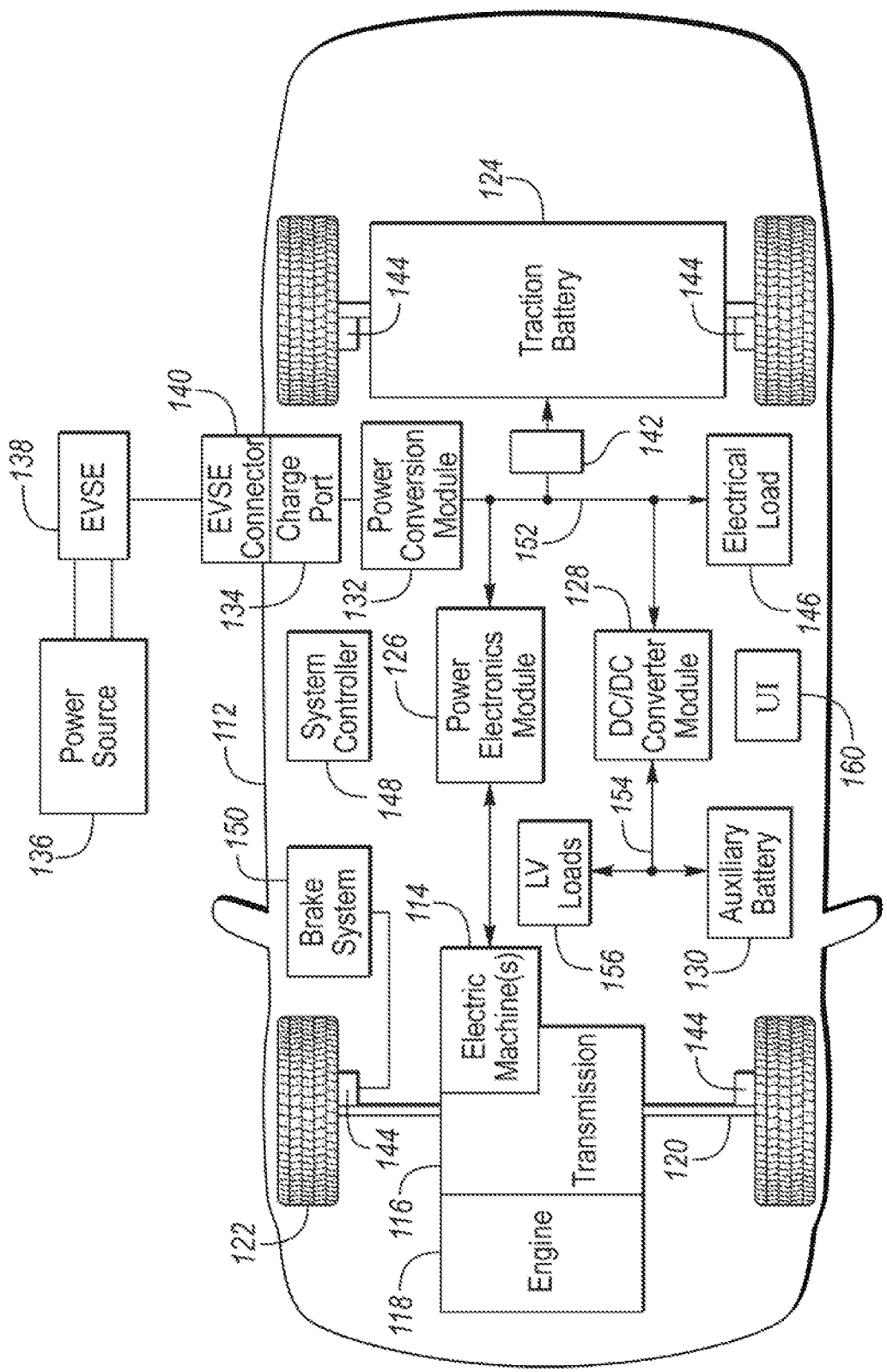
FIG. 1 depicts a possible configuration for an electrified vehicle.

FIG. 1 depicts an electrified vehicle 112 that may be referred to as a plug-in hybrid-electric vehicle (MEV). A plug-in hybrid-electric vehicle 112 may comprise one or more electric machines 114 mechanically coupled to a gearbox or hybrid transmission 116. The electric machines 114 may be capable of operating as a motor and a generator. In addition, the hybrid transmission 116 is mechanically coupled to an engine 118. The hybrid transmission 116 is also mechanically coupled to a drive shaft 120 that is mechanically coupled to the wheels 122, The electric machines 114 can provide propulsion and regenerative braking capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present.

A battery pack or traction battery 124 stores energy that can be used by the electric machines 114. The traction battery 124 may provide a high voltage direct current (DC) output. A contactor module 142 may include one or more contactors configured to isolate the traction battery 124 from a high-voltage bus 152 when opened and connect the traction battery 124 to the high-voltage bus 152 when closed. The high-voltage bus 152 may include power and return conductors for carrying current over the high-voltage bus 152. The contactor module 142 may be located in the traction battery 124. One or more power electronics modules 126 (also known as an inverter) may be electrically coupled to the high-voltage bus 152. The power electronics modules 126 are also electrically coupled to the electric machines 114 and provide the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

In addition to providing energy for propulsion, the traction battery 124 may provide energy for other vehicle electrical systems. The vehicle 112 may include a DC/DC converter module 128 that converts the high voltage DC output from the high-voltage bus 152 to a low-voltage DC level of a low-voltage bus 154 that is compatible with low-voltage loads 156. An output of the DC/DC converter module 128 may be electrically coupled to an auxiliary battery 130 (e.g., 12V battery) for charging the auxiliary battery 130. The low-voltage loads 156 may be electrically coupled to the auxiliary battery 130 via the low-voltage bus 154. One or more high-voltage electrical loads 146 may be coupled to the high-voltage bus 152. The high-voltage electrical loads 146 may have an associated controller that operates and controls the high-voltage electrical loads 146 when appropriate. Examples of high-voltage electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charge station or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for coupling to a charge port 134 of the vehicle 112. The charge port 134 may be any type of port configured to transfer power from the EVSE 138 to the vehicle 112. The charge port 134 may be electrically coupled to an on-board power conversion module or charger. The charger 132 may condition the power supplied from the EVSE 138 to provide the proper voltage and current levels to the traction battery 124 and the high-voltage bus 152. The charger 132 may be electrically coupled to the contactor module 142. The charger 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

Wheel brakes 144 may be provided for slowing the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144. The brake system 150 may respond to driver commands and may also operate autonomously to implement features such as stability control. The controller of the brake system 150 may implement a method of applying a requested brake force when requested by another controller or sub-function.

The electrified vehicle 112 may further include a user interface 160. The user interface 160 may provide a variety of display elements for communicating information to the operator. The user interface 160 may provide a variety of input elements for receiving information from the operator. The user interface 160 may include one or more displays. The displays may be touch-screen displays. The user interface 160 may include discrete lamps/lights. For example, the lamps may include light-emitting diodes (LED). The user interface 160 may include switches, rotary knobs, and buttons for allowing the operator to change various settings. The user interface 160 may include a control module that communicates via the vehicle network. The user interface 160 may provide one or more display elements that are indicative of charging being inhibited and vehicle operation being inhibited. The user interface 160 may also provide display elements for indicating a single contactor weld condition and a double contactor weld condition. The display elements may include discrete lamps and/or messages in a message display area.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1, but it may be implied that the vehicle network may connect to any electronic modules that are present in the vehicle 112. A vehicle system controller (VSC) 148 may be present to coordinate the operation of the various components.

Figure 2:
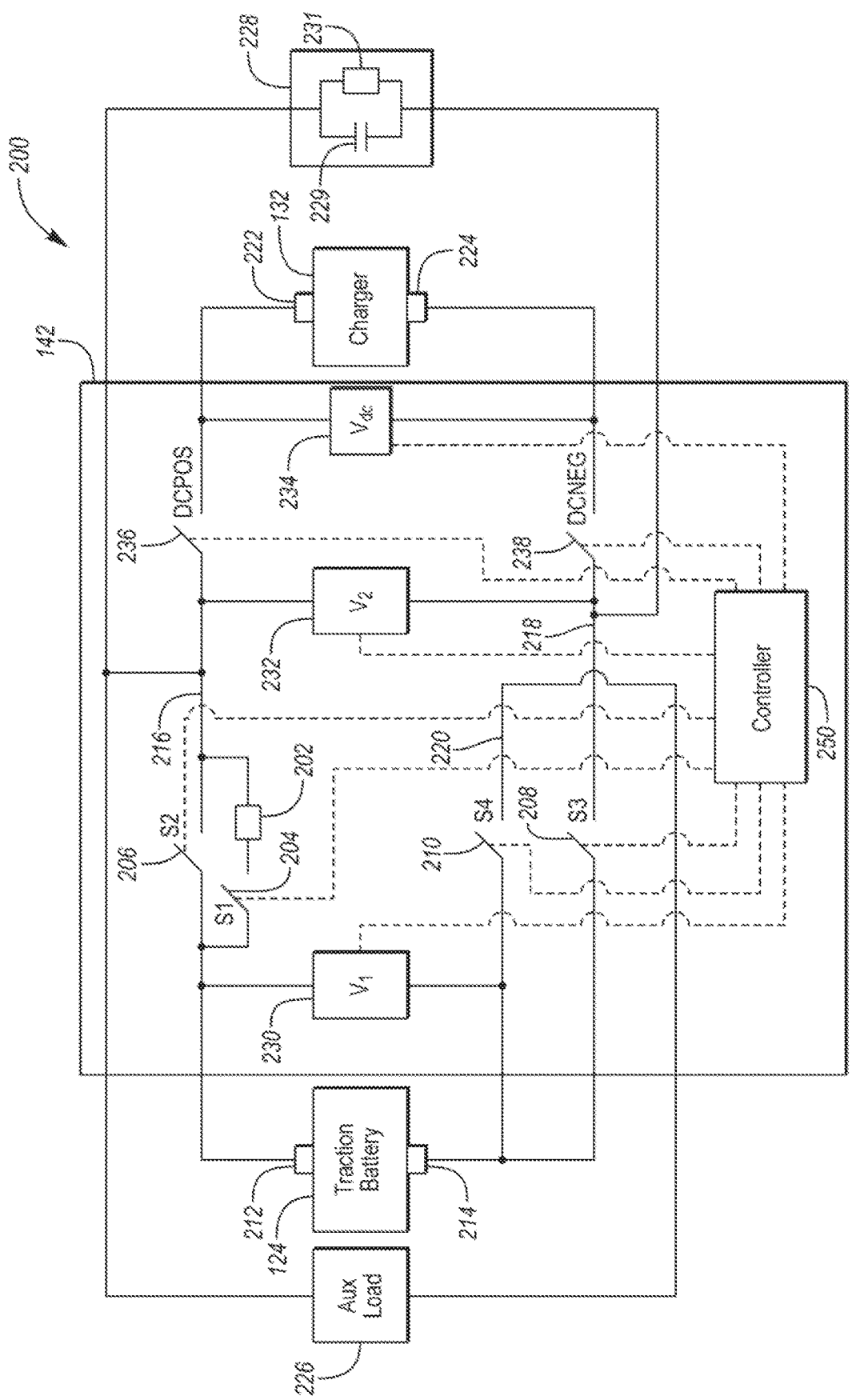
FIG. 2 depicts a possible configuration for contactors in a high-voltage power distribution system for a vehicle.

FIG. 2 depicts a configuration of a high-voltage power distribution system 200 for a vehicle including a plurality of contactors. The contactor module 142 may include a pre-charge contactor 204 (S1) that is electrically coupled in series with a precharge resistor 202. The precharge resistor 202 may limit the current flowing through the high-voltage bus 152 during startup when the traction battery 124 is initially connected to the high-voltage bus 152. The pre-charge contactor 204 may be configured to selectively couple a terminal of the traction battery 124 to the high-voltage bus 152 through the impedance element 202. The contactor module 142 may include a main contactor 206 (S2) that is configured to selectively electrically couple a positive terminal 212 of the traction battery 124 to a positive-side conductor 216 of the high-voltage bus 152. The contactor module 142 may include a high-voltage return contactor 208 (S3) that is configured to selectively electrically couple a traction battery return terminal 214 (return terminal of the traction battery 124) to a negative-side or return conductor 218 of the high-voltage bus 152 (e.g., return side of the power electronics module 126). The contactor module 142 may include an auxiliary load return contactor 210 (S4) that is configured to selectively electrically couple the traction battery return terminal 214 to an electrical load return conductor 220 to which an auxiliary load 226 may be connected.

The power distribution system 200 may also include an interface for the charger 132 to interface with the high-voltage bus 152. A charger positive contactor 236 may be electrically coupled between a charger positive terminal 222 and the positive-side conductor 216. A charger return contactor 238 may be electrically coupled between a charger return terminal 224 and the return conductor 218. The charger contactors 236, 238 may be configured to selectively electrically couple terminals for connecting to a charger 132 to corresponding terminals of the high-voltage bus 152. For example, when charging of the traction battery 124 is desired, the charger 132 may be coupled to the high-voltage bus 152 via the charger positive contactor 236 and the charger return contactor 238. During charge events, the main contactor 206, high-voltage return contactor 208, and the auxiliary load return contactor 210 may be closed. In some configurations, the charger 132 may be an off-board module that connects to the high-voltage bus 152 via the charge port 134. In some configurations, the charger positive terminal 222 and the charger return terminal 224 may be coupled directly to the charge port 134.

One or more high-voltage loads 228 may be electrically coupled to the high-voltage bus 152. The high-voltage loads 228 may include a capacitive element 229 and a parallel impedance 231. The capacitive element 229 may hold charge and limit the decay rate of the HV-bus voltage. When disconnected from the high-voltage bus 152, the capacitive element 229 may discharge energy through the parallel impedance 231. Upon disconnection, the voltage across the high-voltage load 228 may decay toward zero. In addition, the capacitive element 229 can cause large inrush currents when not charged. Connection of the high-voltage loads 228 may be established by closing the high-voltage return contactor 208 and the main contactor 206/precharge contactor 204.

An auxiliary load 226 may also be electrically coupled between the positive-side conductor 216 and the high-voltage return conductor 220. Connection of the auxiliary load 226 may be established by closing the auxiliary load return contactor 210 and the main contactor 206 or precharge contactor 204. The auxiliary load 226 may include the DC/DC converter module 128 that drives the low-voltage bus 154.

The contactors 204, 206, 208, 210, 236, 238 may be electromagnetic switches such as a relay. The contactors may include a coil that opens or closes an associated switch when energized. For example, the contactors may be normally-open contactors such that the switch is opened when the coil is de-energized and closed when the coil is energized. A coil may be energized by applying a voltage across the coil to cause current to flow in the coil. The coils may be electrically coupled to a controller 250 that is configured to provide voltage and current to the coils. In some configurations, the contactors may be solid-state devices such as an Insulated Gate Bipolar Transistor (IGBT) or similar device. The controller 250 may be configured to drive the coils using hardware components and software functions. The controller 250 may be part of the contactor module 142. In some configurations, features of the controller 250 may be performed by one or more external controllers (e.g., a battery control module controller and/or system controller 148). The controller 250 may include a processing unit for executing instructions and programs. The controller 250 may include volatile and non-volatile memory for storing programs and data. The controller 250 may include driver/interface circuitry for operating the contactors.

The power distribution system 200 may include voltage sensors that are configured to measure voltages that are present. A battery voltage sensor 230 may be configured to measure a voltage across the traction battery 124 (battery voltage). A high-voltage bus voltage sensor 232 may be configured to measure a voltage across the high-voltage bus 152 (voltage across positive-side conductor 216 and the return conductor 218 (HV-bus voltage), A charger voltage sensor 234 may be configured to measure the voltage across the charger positive terminal 222 and the charger return terminal 224 or charger 132 (charger voltage). In addition, current sensors may be present that are configured to measure the current passing through conductors of the power distribution system 200. The controller 250 may include interface circuitry to properly scale and isolate the signals provided by the voltage and current sensors.

The contactors may be monitored to ensure proper operation. As the controller 250 operates the contactors, the controller 250 may be aware of the desired or commanded state (e.g., open or closed) for each of the contactors. When a contactor is not responding correctly (e.g., closed when commanded to be open), the controller 250 may generate a diagnostic trouble code to aid in servicing the vehicle. In addition, the controller 250 may inhibit vehicle functions including charging and propulsion. The controller 250 may also cause a display element that is descriptive of the condition to be displayed on the user interface 160.

A contactor may become inoperative due to being welded closed. For example, a contactor may become welded closed when trying to close the contactor in the presence of a large voltage across the contactor. As the contactor is closed, the large voltage may cause a current flow across the switch gap before the switch is fully closed. This current may create enough heat to melt the conductive material and weld the contactor closed. The welded contactor may present issues as the contactor no longer provides an isolation function when welded closed. That is, the contactor cannot be commanded to open and is permanently closed. As such, it is desirable to detect a welded contactor and provide an indication to the operator.

The charger contactors (236, 238) may be used during charge events, A charge event may be initiated by coupling the charge connector 140 to the charge port 134. The controller 250 may perform operations to begin charging the traction battery 124. For example, the controller 250 may initiate a precharge cycle by closing the return contactor 208, auxiliary load return contactor 210, and the precharge contactor 204 to cause the HV-bus voltage to rise to the voltage level of the traction battery 124 or a predetermined bus voltage. For example, the predetermined bus voltage may a percentage of the traction battery voltage (e.g., 90%). When the HV-bus voltage has reached predetermined bus voltage, the controller 250 may close the main contactor 206 and open the precharge contactor 204. The controller 250 may command the charger 132 to output a voltage that is approximately the voltage of the traction battery 124 before closing the charger contactors 236, 238.

In some systems, a weld test may be performed on each contactor after the contactor is commanded to open. The following discussion is focused on weld testing for the charger positive contactor 236 and the charger return contactor 238. One strategy for performing a weld check may be to open each of the charger contactors 236, 238 individually and check for a weld condition. Using the individual weld check strategy, each of the charger contactors 236, 238 may be tested after a charge cycle, During a charge cycle, both the charger positive contactor 236 and the charger return contactor 238 are operated in a closed state. This allows the charger 132 to electrically couple to the traction battery 124 (assuming other contactors are closed as well) to permit charging.

One strategy for weld detection is to compare the HV-bus voltage (measured by the HV-bus voltage sensor 232) to the charger voltage (measured by the charger voltage sensor 234) during the period when the main contactor 206, the high-voltage return contactor 208, and the auxiliary load return contactor 210 are closed. During a drive cycle in which the charger 132 is not coupled to the high-voltage bus 152, the charger voltage should not follow the HV-bus voltage. If the charger voltage is approximately equal to the HV-bus voltage, a double-weld condition of the charger contactors 236, 238 may be suspected. During a drive cycle, the charger contactors 236, 238 may be commanded open to isolate the HV-bus 152 from the charger terminals.

During a charge event (charger 132 is coupled to the power distribution system), the weld check may be suspended under certain conditions. The charger 132 may normally be commanded to drop the voltage and current output at the end of a charge event. A false weld detection may occur if the charger 132 does not drop the voltage output at the end of a charge event and the charger contactors 236, 238 are commanded to open. In this situation, the HV-bus voltage and the charger voltage may be approximately the same value. This condition may be flagged as a charger diagnostic, rather than a welded contactor. However, in this situation, a double-welded contactor condition cannot be reliably detected. As such, a double-welded contactor condition may not be detected until proper termination of a charge event.

When the charger contactors 236, 238 are both welded closed, voltage may be present at across the charger terminals (222, 224) when the main contactor 206 and the high-voltage return contactor 208 are closed. The system may be configured to detect the double-welded charger contactor condition prior to completely energizing the high-voltage bus 152. One strategy may be to compare the HV-bus voltage to the charger voltage during the bus precharge operation. During precharge, the precharge contactor 204 may be closed. The precharge resistor 202 limits the flow of current to the HV-bus. During precharge, the HV-bus voltage will increase at a predetermined rate up to the battery voltage. If the charger contactors 236, 238 are welded closed, the charger voltage should be the same as the HV-bus voltage. However, the voltage sensors may have different filtering characteristics. The filtering may be implemented as hardware and/or software. During the transient portion of the precharge (e.g., voltage increasing), the equality condition may not be satisfied leading to double-weld condition not being detected. Detecting the double-weld condition in this manner may be achieved by tuning of the algorithm which may require addition time and cost.

The controller 250 may be programmed to command the charger contactors 236, 238 to an open state for a drive cycle and command the precharge contactor 204 (and the high-voltage return contactor 208) to close at a start of the drive cycle. The controller 250 may be programmed to, responsive to a voltage across the terminals 222, 224 for connecting to the charger 132 changing from being less than a first predetermined voltage immediately prior to the precharge contactor 204 being closed to being greater than a second predetermined voltage at a completion of precharging, inhibit vehicle operation and disconnect the traction battery 124 from the high-voltage bus 152. The first predetermined voltage may be a threshold indicative of the voltage being approximately zero (e.g., 10V). The second predetermined voltage may be a threshold indicative of the voltage being approximately a nominal voltage of the traction battery 124 (e.g., 250V for a battery voltage of 300V). The second predetermined voltage may be a threshold indicative of the voltage being at a high-voltage level (e.g., 60V) above which external exposure is to be prevented. The controller 250 may be further programmed to output a diagnostic code indicative of a double welded charger contactor condition responsive to inhibiting vehicle operation.

The controller 250 may be programmed to, responsive to the voltage across the terminals 222, 224 for connecting to the charger 132 being less than the first predetermined voltage immediately prior to the precharge contactor 204 being closed and the voltage across the terminals 222, 224 for connecting to the charger 132 being less than the first predetermined voltage at the completion of precharging, command the main contactor 206 to close and open the precharge contactor 204. This addresses the operation when the charger contactors 236, 238 are operating normally. The controller 250 may be programmed to, responsive to a voltage across the high-voltage bus 152 being greater than the second predetermined voltage and the voltage across terminals 222, 224 for connecting to the charger 132 being greater than the second predetermined voltage prior to the precharge contactor 204 being closed, inhibit vehicle operation and prevent connection of the traction battery 124 to the high-voltage bus 152. This addresses operation when there is a double-weld condition of the charge contactors 236, 238 and a high voltage is present on the high-voltage bus 152 prior to the ignition on.

The controller 250 may be programmed to, responsive to a difference between a first voltage measured across the terminals 222, 224 for connecting to the charger 132 while the precharge contactor 204 is closed and a second voltage measured across the terminals 222, 224 for connecting to a charger 132 immediately prior to closing the precharge contactor 204 being greater than a threshold for a predetermined time, open the precharge contactor 204 and prevent connection of the traction battery 124 to the high-voltage bus 152, The threshold may be indicative of the voltage across the terminals 222, 224 for connecting to the charger 132 increasing during precharging.

Figure 3:
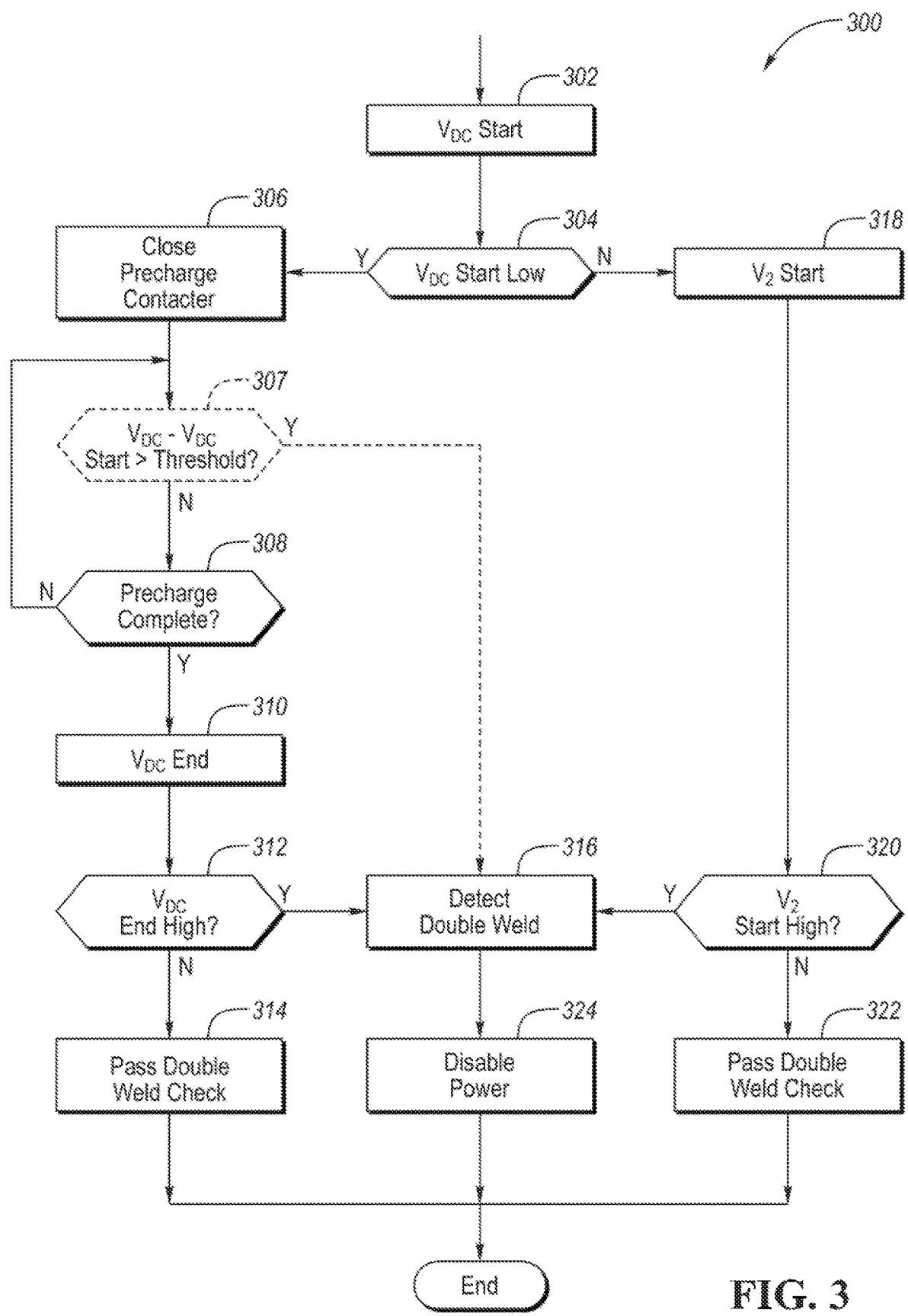
FIG. 3 depicts a flowchart for a possible sequence of operation for controlling the contactors of the high-voltage power distribution system.

FIG. 3 depicts a flow chart for a possible sequence of operations for performing a double-weld check of the charger contactors 236, 238. The sequence of operations may be triggered at the start of a drive cycle. A drive cycle may be initiated by an ignition-on condition (e.g., vehicle placed in a run condition). Further, the drive cycle may include a vehicle power-up in which charging is not requested, That is, the charger 132 is not connected to an external power supply or the EVSE connector 140 is not coupled to the charge port 134. Prior to executing the operations, the charger contactors 236, 238 are commanded to be open. At the start of a drive cycle, the charger contactors 236, 238 may be commanded to the open state.

At operation 302, a charger start voltage ($V_{DC}$ start) may be measured before any contactors (e.g., precharge contactor 204) are commanded to close. At operation 304, the charger start voltage may be compared to a threshold. The threshold may be a low-voltage threshold, if the charger start voltage is less than the threshold, then operation 306 may be performed. If the charger start voltage is greater than or equal to the threshold, operation 318 may be performed.

At operation 306, a precharge cycle may be initiated by commanding the precharge contactor 204 and the high-voltage return contactor 208 to close. At operation 307, a difference between a measured charger voltage (VDC) and the charge start voltage may be compared to a voltage threshold. Operation 307 may be optional depending on the configuration. At operation 307, the voltage behavior is monitoring during the precharge operation. When the charger contactors 236, 238 are not welded closed, the charger voltage is not expected to change. Operation 307 checks if the charger voltage is changing during the precharge operation. If the difference exceeds the voltage threshold, the precharge cycle may be exited and operation 316 may be performed to identify a double weld condition. If the difference is less than or equal to the voltage threshold, operation 308 may be performed.

At operation 308, the precharge cycle may be monitored for completion. For example, the precharge may be completed when the HV-bus voltage exceeds a threshold and/or is within a predetermined amount of the battery voltage. If the precharge cycle is not completed, operation 308 may be repeated. If the precharge cycle is completed, operation 310 may be performed.

At operation 310, a charger end voltage ($V_{DC}$ end) may be measured. At operation 312, the charger end voltage may be compared to a high threshold. The high threshold may be indicative of a high voltage across the charger terminals. If the charger end voltage is less than the high threshold, operation 314 may be performed. At operation 314, a flag may be set to indicated that the charger double-weld check has passed successfully. If the charger end voltage exceeds the high threshold, then operation 316 may be performed.

At operation 316, a charger contactor double weld check may be detected. A diagnostic code indicative of the condition may be stored and an indication may be displayed on the user interface 160. At operation 324, the power distribution system may be disabled, Disabling the power distribution system may include commanding all of the contactors to open. Disabling the power distribution system may isolate the voltage from the charger terminals.

If the charger start voltage at operation 304 exceeds the low-voltage threshold, operation 318 may be performed. At operation 3118, a starting HV-bus voltage ($V_2$ start) may be measured. At operation 320, the starting HV-bus voltage may be compared to a high-voltage threshold. If the starting HV-bus voltage does not exceed the high-voltage threshold, operation 322 may be performed. At operation 322, a flag may be set to indicated that the charger double-weld check has passed successfully. If the starting HV-bus voltage exceeds the high-voltage threshold, operation 316 may be performed to identify the double welded charger contactor condition, followed by operation 324 to disable the power distribution system.

The above logic may detect a double-weld condition of the charger contactors 236, 238 during the power-up stage. The charger voltage may be expected to start a drive cycle at a low voltage level. The first logic path including operations 306-312 may reflect a startup condition in which the charger voltage is low. When both charger contactors 236, 238 are welded closed, the charger voltage may be expected to increase during the precharge cycle. If the charger voltage is high after the precharge cycle it is likely that the charger contactors 236, 238 are welded closed.

The second logic path including operations 318-320 may cover a condition in which the high-voltage bus 152 is at a high voltage at the start of the powerup cycle. This may represent a condition in which the charger is connected and supplying a high-voltage level, but is not recognized as such. A high voltage may be present at the start of the powerup cycle if the high-voltage bus 152 is not discharged after the previous power-down cycle and an ignition on cycle is initiated before the high-voltage bus 152 is discharged. A high-voltage may be present on the high-voltage bus 152 when the vehicle is being towed due to back EMF from the electric machine 114 through the inverter 126. To identify these situations, a check may be performed to determine if the voltage level of the HV-bus is at a high-level. If the HV-bus voltage is at a high-level, then is may be suspected that the charger contactors 236, 238 are welded closed.

An alternative solution may be to monitor the change in the charger voltage during the precharge operation as represented by optional operation 307. The controller 250 may compute a difference between the present charger voltage and the starting charger voltage. If the difference exceeds a predetermined threshold, a double-weld condition may be suspected. An advantage of this strategy is that the difference may be less than the high-voltage level previously used.

A method for implementing the double-weld detection strategy may include commanding charger contactors 236, 238 disposed between terminals 222, 224 for connecting to a charger 132 to corresponding terminals of a high-voltage bus 152 to open at a start of a drive cycle. The method may include commanding the precharge contactor 204 that couples a traction battery 124 to a high-voltage bus 152 through an impedance 202 to close (may include closing the high-voltage return contactor 208). The method may include disconnecting the traction battery 124 from the high-voltage bus 152 responsive to a voltage across the terminals 222, 224 for connecting to the charger 132 changing from being less than a first predetermined voltage immediately prior to the precharge contactor 204 being closed to being greater than a second predetermined voltage at a completion of precharging. The method may include outputting a diagnostic code indicative of a double weld contactor condition. The method may include preventing connection of the traction battery 124 to the high-voltage bus 152 responsive to a voltage across the high-voltage bus 152 being greater than the second predetermined voltage and the voltage across terminals 222, 224 for connecting to the charger 132 being greater than the second predetermined voltage prior to the precharge contactor 204 being closed. The method may include commanding the main contactor 206 to close and opening the precharge contactor 204, both responsive to the voltage being less than the first predetermined voltage immediately prior to the precharge contactor 204 being closed and the voltage being less than the second predetermined voltage at the completion of precharging. The method may further include, responsive to a difference between a first voltage measured across the positive 222 and return 224 terminals while the precharge contactor 204 is closed and a second voltage measured across the positive 222 and return 224 terminals immediately prior to closing the precharge contactor 204 being greater than a threshold for a predetermined time, opening the precharge contactor 204 and preventing connection of the traction battery 124 to the high-voltage bus 152.

The power distribution system 200 of FIG. 2 includes the traction battery 124 that is coupled to the high-voltage bus 152 via the main contactor 206, the precharge contactor 204, the high-voltage return contactor 208, and the auxiliary load return contactor 210. The charger 132 is coupled to the high-voltage bus 152 via the charger positive contactor 236 and the charger return contactor 238. Other configurations of connecting the charger 132 are possible.

Figure 4:
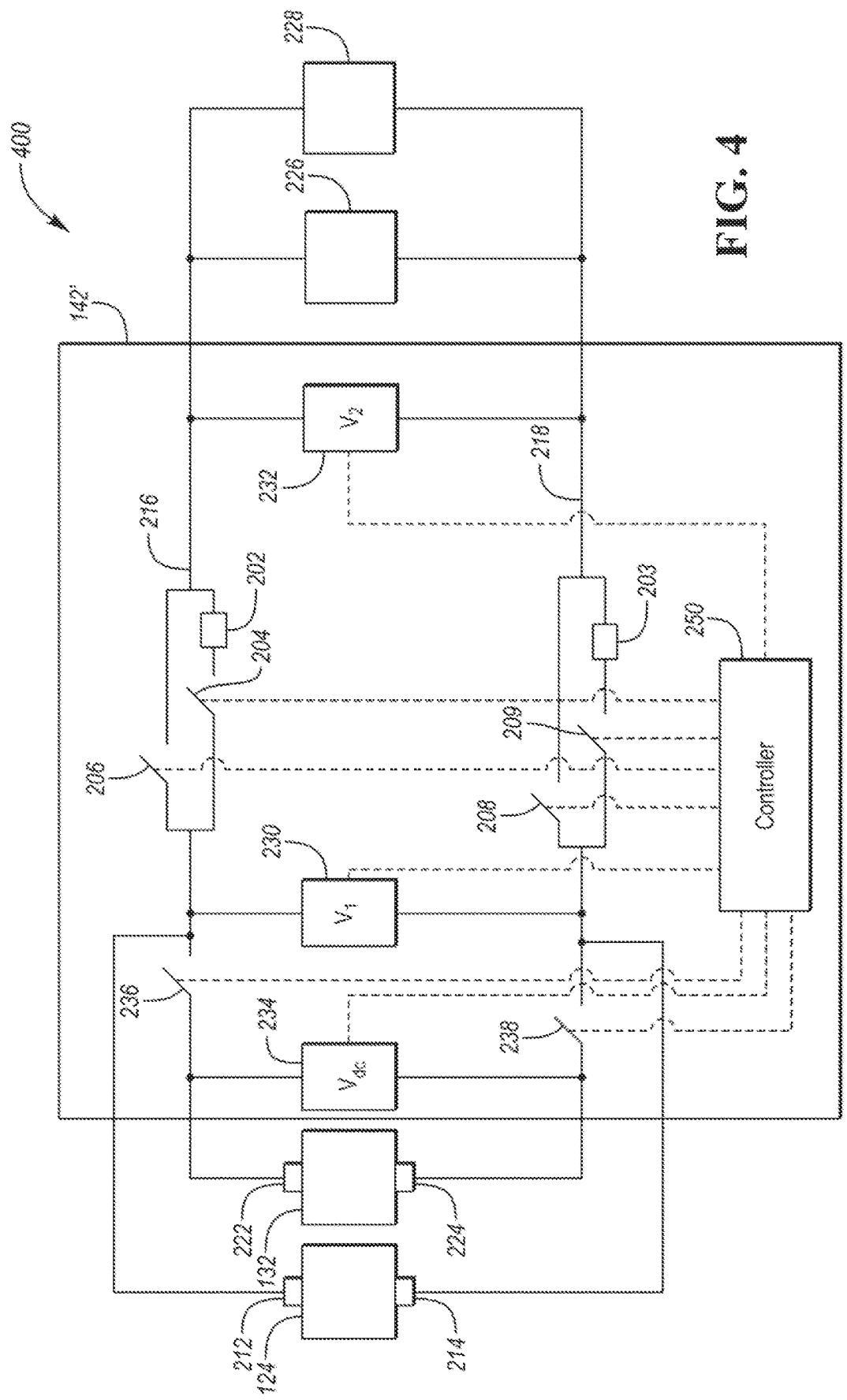
FIG. 4 depicts an alternative configuration for the contactors in a high-voltage vehicle power distribution system for the vehicle.

An alternative power distribution system 400 is depicted in FIG. 4. A contactor module 142' may be configured with a different arrangement of components when compared to the contactor module 142 of FIG. 2. Similarly numbered elements may operate as described above. The following describes the differences. The traction battery 124 may be connected to the positive-side conductor 216 of the high-voltage bus 152 via a main contactor 206 and a precharge contactor 204. The traction battery 124 may connected to the return-side conductor 218 of the high-voltage bus 152 via a return contactor 208 and a return-side precharge contactor 209 (with associated return-side precharge resistor 203). The high-voltage loads 228 and auxiliary loads 226 may be electrically coupled to the high-voltage bus 152.

A charger 132 may be electrically coupled to the traction battery 124 via a charger positive contactor 236 and a charger return contactor 238. In this configuration, the charger 132 and traction battery 124 may be electrically coupled during a charge event without applying voltage to the high-voltage bus 152. In such cases, the charger 132 may include a low-voltage power supply to power components on the low-voltage bus 154. The strategy for operating the charger positive contactor 236 and a charger return contactor 238 above is applicable to this configuration as well. The charger contactor control strategy is applicable to other configurations as well.

The weld-detection strategy disclosed detects the double welded charger contactor in a timely manner. Further, the weld-detection strategy is capable of detecting the condition during a drive cycle and is not limited to only detecting the condition during a charge cycle.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   charger contactors configured to selectively electrically couple terminals for connecting to a charger to corresponding terminals of a high-voltage bus;
   a precharge contactor configured to selectively couple a battery to the high-voltage bus through an impedance element; and
   a controller programmed to, at a start of a drive cycle, command the charger contactors to open and then command the precharge contactor to close for charging the high-voltage bus to a predetermined bus voltage and, responsive to a voltage across the terminals for connecting to the charger changing from being less than a first predetermined voltage immediately prior to the precharge contactor being closed to being greater than a second predetermined voltage when the high-voltage bus is charged to the predetermined bus voltage, command the precharge contactor to open and command a main contactor coupled between the battery and the high-voltage bus to remain open to disconnect the battery from the high-voltage bus and prevent vehicle operation.

2. The vehicle of claim 1, wherein the first predetermined voltage is a threshold indicative of the voltage being approximately zero.

3. The vehicle of claim 1, wherein the second predetermined voltage is a threshold indicative of the voltage being at a high-voltage level.

4. The vehicle of claim 1, wherein the controller is further programmed to, responsive to a voltage across the high-voltage bus being greater than the second predetermined voltage and the voltage across terminals for connecting to the charger being greater than the second predetermined voltage prior to the precharge contactor being closed, command the precharge contactor to open and command the main contactor to remain open to inhibit vehicle operation and prevent connection of the battery to the high-voltage bus.

5. The vehicle of claim 1, wherein the controller is further programmed to output a diagnostic code indicative of a double weld contactor condition responsive to inhibiting vehicle operation.

6. The vehicle of claim 1, wherein the controller is programmed to, responsive to the voltage being less than the first predetermined voltage immediately prior to the precharge contactor being closed and the voltage being less than the second predetermined voltage when the high-voltage bus is charged to the predetermined bus voltage, command the main contactor to close and command the precharge contactor to open.

7. The vehicle of claim 1, wherein the controller is further programmed to, responsive to a difference between a first voltage measured across the terminals for connecting to the charger while the precharge contactor is closed and a second voltage measured across the terminals for connecting to the charger immediately prior to closing the precharge contactor being greater than a threshold for a predetermined time, command the precharge contactor to open and command the main contactor to remain open to prevent connection of the battery to the high-voltage bus.

8. A vehicle comprising:
   charger contactors configured to selectively electrically couple positive and return terminals for connecting to a charger to corresponding terminals of a high-voltage bus;
   a precharge contactor configured to selectively couple a battery to the high-voltage bus through an impedance element; and
   a controller programmed to, at a start of a drive cycle, command the charger contactors to open and then command the precharge contactor to close, and, responsive to a difference between a first voltage measured across the positive and return terminals when the precharge contactor is closed and a second voltage measured across the positive and return terminals immediately prior to closing the precharge contactor being greater than a predetermined threshold, command the precharge contactor to open and command a main contactor coupled between the battery and the high-voltage bus to remain open to prevent connection of the battery to the high-voltage bus.

9. The vehicle of claim 8, Wherein the predetermined threshold is indicative of the difference increasing during precharging.

10. The vehicle of claim 8, wherein the controller is further programmed to output a diagnostic code indicative of a double weld contactor condition responsive to inhibiting vehicle operation.

11. The vehicle of claim 8, herein the controller is further programmed to, responsive to the difference being less than the predetermined threshold for a duration of precharging, command the main contactor to close and command the precharge contactor to open.

12. The vehicle of claim 8, wherein the controller is further programmed to, responsive to voltage across the high-voltage bus being greater than a predetermined voltage and voltage across terminals for connecting to the charger being greater than the predetermined voltage prior to the precharge contactor being closed, command the precharge contactor to open and command the main contactor to remain open to prevent connection of the battery to the high-voltage bus and inhibit vehicle operation.

13. The vehicle of claim 12, wherein the predetermined voltage is a threshold indicative of voltage across terminals for connecting to the charger exceeding a high-voltage level.

14. A method comprising:
commanding, by a controller, charger contactors disposed between terminals for connecting to a charger to corresponding terminals of a high-voltage bus to open at a start of a drive cycle;
commanding, by a controller, a precharge contactor that couples a traction battery to a high-voltage bus through an impedance to close for charging the high-voltage bus to a predetermined bus voltage; and
commanding, by the controller, the precharge contactor to open and commanding a main contactor coupled between the traction battery and the high-voltage bus to remain open responsive to a voltage across the terminals for connecting to the charger changing from being less than a first predetermined voltage immediately prior to the precharge contactor being closed to being greater than a second predetermined voltage when the high-voltage bus is charged to the predetermined bus voltage.

15. The method of claim 14 further comprising outputting, by the controller, a diagnostic code indicative of a double weld contactor condition.

16. The method of claim 14, wherein the first predetermined voltage is a threshold indicative of the voltage being approximately zero.

17. The method of claim 14, wherein the second predetermined voltage is a threshold indicative of the voltage being at a high-voltage level.

18. The method of claim 14 further comprising commanding, by the controller, the precharge contactor to open and commanding a main contactor coupled between the traction battery and the high-voltage bus to remain open responsive to a voltage across the high-voltage bus being greater than the second predetermined voltage and the voltage across terminals for connecting to the charger being greater than the second predetermined voltage prior to the precharge contactor being closed.

19. The method of claim 14 further comprising commanding, by the controller, the main contactor to close and commanding the precharge contactor to open, both responsive to the voltage being less than the first predetermined voltage immediately prior to the precharge contactor being closed and the voltage being less than the second predetermined voltage when the high-voltage bus is charged to the predetermined bus voltage.

20. The method of claim 14 further comprising, responsive to a difference between a first voltage measured across the terminals for connecting to a charger while the precharge contactor is closed and a second voltage measured across the for connecting to a charger immediately prior to closing the precharge contactor being greater than a threshold for a predetermined time, commanding the precharge contactor to open and command the main contactor to remain open to prevent connection of the traction battery to the high-voltage bus.

* * * * *